United States Patent [19]
Holleck

[11] Patent Number: 5,182,238
[45] Date of Patent: Jan. 26, 1993

[54] PROTECTIVE LAYER OF HARD MATERIAL WITH HOMOGENEOUS DISTRIBUTION OF ELEMENTS

[75] Inventor: Helmut Holleck, Karlsruhe, Fed. Rep. of Germany

[73] Assignee: Kernforschungszentrum Karlsruhe GmbH, Fed. Rep. of Germany

[21] Appl. No.: 335,601

[22] Filed: Apr. 10, 1989

[30] Foreign Application Priority Data

Apr. 9, 1988 [DE] Fed. Rep. of Germany ....... 3811907

[51] Int. Cl.$^5$ .............................................. B32B 9/00
[52] U.S. Cl. ..................................... 501/91; 428/446; 428/457; 428/469; 428/697; 428/698; 428/699; 501/87; 501/92; 501/97
[58] Field of Search ............... 428/698, 699, 457, 469, 428/472, 446, 450, 408, 337, 697; 51/308, 295, 309; 501/88, 91, 92, 93, 96, 97

[56] References Cited

U.S. PATENT DOCUMENTS

| | | | |
|---|---|---|---|
| 3,955,038 | 5/1976 | Lindstrom et al. | 428/457 |
| 4,145,224 | 3/1979 | Mehalchick et al. | 501/97 |
| 4,284,687 | 8/1981 | Dreyer et al. | 428/472 |
| 4,336,215 | 6/1982 | Yajima et al. | 501/91 |
| 4,399,168 | 8/1983 | Kullander et al. | 428/698 |
| 4,447,263 | 5/1984 | Sugizawa et al. | 428/698 |
| 4,469,801 | 9/1984 | Hirai et al. | 428/408 |
| 4,522,453 | 6/1985 | Lammer et al. | 428/698 |
| 4,525,415 | 6/1985 | Porat | 428/698 |
| 4,598,024 | 7/1986 | Stinton et al. | 428/698 |
| 4,645,715 | 2/1987 | Ovshinsky et al. | 428/698 |
| 4,670,024 | 6/1987 | Bhat et al. | 51/308 |
| 4,675,206 | 6/1987 | Ikegaya et al. | 427/38 |
| 4,714,660 | 12/1987 | Gates, Jr. | 428/698 |
| 4,731,302 | 5/1988 | Weissmantel et al. | 428/698 |
| 4,749,630 | 6/1988 | König et al. | 428/699 |
| 4,835,062 | 5/1989 | Holleck | 428/469 |
| 4,847,157 | 7/1989 | Goodman et al. | 428/446 |
| 4,961,529 | 10/1990 | Gottselig et al. | 428/337 |

FOREIGN PATENT DOCUMENTS 0229522 7/1987 European Pat. Off. .

OTHER PUBLICATIONS

"Electric Properties of Ti-Si-N Thin Cement Films Deposited in a Triode Sputtering System with a Hot Cathode", W. Posadowski, Thin Solid Films, vol. 162, Aug. 1988, pp. 111 to 117, Elsevier Sequoia, Lausanne, Switzerland.

"Structure of Thin Films Prepared by the Cosputtering of Titanium and Aluminum or Titanium and Silicon", G. Beensh-Marchwicka et al, Thin Solid Films, vol. 82, 1981, pp. 313-320, Elseview Sequoia, Lausanne, Switzerland.

World Patent Index, No. 77-13584Y/08.

Primary Examiner—Ellis P. Robinson
Assistant Examiner—Archene A. Turner
Attorney, Agent, or Firm—Sughrue, Mion, Zinn, Macpeak & Seas

[57] ABSTRACT

A primarily crystalline, titanium-containing protective layer of hard material with homogeneous distribution of elements on the surfaces of a substrate material. The protective layer comprises a stabilized mixed phase having a crystal structure made of a metallic hard material which is at least one material selected from TiN and TiC and a covalent hard material which is at least one material selected from SiC and $Si_3N_4$.

8 Claims, 4 Drawing Sheets

PROTECTIVE LAYER OF HARD MATERIAL WITH HOMOGENEOUS DISTRIBUTION OF ELEMENTS

BACKGROUND OF THE INVENTION

The present invention relates to a primarily crystalline, titanium-containing protective layer of hard material having a homogeneous distribution of elements for the surface of a substrate material which can be highly stressed.

The protection of substrate materials by means of surface treatment or coating has gained in importance in light of the special requirements imposed by new and advanced technologies, such as high temperature materials, and due to the demand for a less abrasive material with longer edge life, for example, for metal cutting material processing.

Many conditions that are often difficult to satisfy at the same time must be considered with hard material coating.

The problem of finding a suitable hard material which can be used as a coating material is based on the fact that not all requirements can be met with a single hard material and that the required properties may even be in part mutually exclusive.

The constitution of the material system, the manufacturing parameters and the microstructure continue to play an important role in the coating of materials.

Hard materials fall into three groups based on their varying bonding structure:

(a) heteropolar hard materials (oxides of aluminum, zirconium, titanium and beryllium).

(b) covalent hard materials (borides, carbides, and nitrides of aluminum, silicon, boron and diamond).

(c) metallic hard materials (borides, carbides, and nitrides of the transition metals).

All of these hard materials melt at high temperatures. In part their other properties vary noticeably.

Of course, the heteropolar hard materials are thermodynamically stable and do not interact appreciably with other materials. However, they are brittle and less hard. The thermal coefficient of expansion of the heteropolar hard materials is higher than that of the other hard materials.

The covalent hard materials exhibit high hardness, resistance to oxidation, low coefficient of expansion and low sensitivity to thermal shock. The covalent hard materials are especially advantageous because temperature has only a small influence on the mechanical properties of these materials.

Within this group of covalent hard materials, silicon carbide (SiC) and silicon nitride ($Si_3N_4$) exhibit especially good properties.

Due to the inadequate bonding strength of the covalent hard materials on metal substrates, a narrow range has been placed on its application as a layer material.

The metallic hard materials form the most versatile layer materials.

Due to the high proportion of metal bonds, the metallic hard materials exhibit good adhesive properties. They are less brittle than the other hard materials and have a high electric and thermal conductivity.

A characteristic feature of the metallic hard materials is their frequently complete miscibility.

A protective layer of hard material must fulfill a number of conditions, which may in part be even mutually exclusive.

Thus, the protective layer on the substrate is supposed to have maximum adhesion to the substrate. On the other hand, however, the surface of the coating is to be as inert and oxidation resistant as possible and should not interact with other materials. The protective layer is supposed to be as hard as possible, but still be ductile and impact resistant. Moreover, the temperature coefficients of the protective layer and the substrate must be in the same range so that the protective layer does not flake off under thermal stress. Further, the properties of the protective layer should not change appreciably based on temperature.

Until recently no material has been found that fulfills all of these requirements as a coating material.

Therefore, composite protective layers of hard material that are constructed in a complicated manner are currently used.

Gradient layers can be manufactured with the metallic hard materials in which the composition changes continuously from the surface of the substrate to the surface of the protective layer. An especially adhesive material can be used to form a protective layer portion which adheres to the substrate while the surface of the protective layer comprises a metallic hard material having low tendency for interaction and consequently low adhesion to other materials.

Thus a part of the apparently mutually exclusive requirements can be fulfilled.

Even better results than with gradient layers can be obtained with multi-phased or multi-layered layers according to DE-PS 35 12 986. Such layers can, for example, be produced by sequential sputtering of two different cathodes.

Thus, a layer material having good adhesion properties can be selected as the first layer, and a compound having low adhesion property can be selected as the last, upper-most layer material. The sum of the hardness and the toughness may also be optimized by means of the good constitution of the intermediate interfaces. The formation of a plurality of interfacial junctions between mono-dispersive layers is important.

In their composition, multi-phased multi-layered and gradient layers must be precisely balanced with the properties of the substrate to be coated. The number of parameters to be considered increases thereby even further. Moreover, such a coating process is time-consuming to perform and consequently expensive.

SUMMARY OF THE INVENTION

An object of the present invention is to provide a hard and simultaneously tough layer whereby a substrate material can be protected against high stress.

Another object of the present invention is to provide such a layer which adheres well to the substrate and exhibits a hard, tough, chemically inert, especially oxidation resistant surface, which does not have a tendency to adhere to other materials.

A further object of the present invention is to provide a process for manufacturing a hard and simultaneously tough layer which can protect a substrate material against high stress.

Still another object of the present invention is to provide such a process where the protective layer of hard material is easier to construct than the well-known multi-layered and gradient layers and which takes less time and money to manufacture.

An additional object of the present invention is to provide a process and a protective layer in which the especially advantageous properties of a covalent hard material, such as SiC or $Si_3N_4$, are combined with the good properties of a metallic hard material, in particular of TiC or TiN, into one single layer material.

Additional objects and advantages of the present invention will be set forth in part in the description which follows and in part will be obvious from the description or can be learned by practice of the invention. The objects and advantages are achieved by means of the compositions, processes, instrumentalities and combinations particularly pointed out in the appended claims.

To achieve the foregoing objects and in accordance with its purpose the present invention provides a primarily crystalline. titanium-containing protective layer of hard material having a homogeneous distribution of elements on the surface of a substrate material, which the protective layer comprises a meta-stable mixed phase having a crystal structure made of a metallic hard material which is at least one material selected from titanium nitride (TiN) and titanium carbide (TiC). and a covalent hard material which is at least one material selected from silicon carbide (SiC) and silicon nitride ($Si_3N_4$).

In the present invention, a single protective layer can be provided on the substrate, or multiple protective layers can be provided on the substrate, corresponding to application Ser. No 06/836,628, which is incorporated herein by reference. In each case, the layer or layers comprise a primarily crystalline, single, meta-stable mixed phase as set forth above. The crystal structure generally is a face-centered cubic crystal structure.

The protective layer of the present invention can protect a substrate material against high stress.

The present invention also provides methods for manufacturing the hard protective layer.

One embodiment of a process for manufacturing the protective layer according to the invention by physical gas phase deposition (vapor phase deposition) comprises applying the protective layer to a substrate by magnetron sputtering in an argon atmosphere of a cathode having the composition of the protective layer to form a gas phase, and quenching the protective layer from the gas phase onto the substrate.

Another embodiment of a process for manufacturing the protective layer of the present invention by physical gas phase deposition comprises applying the protective layer to a substrate by reactive sputtering of a metal cathode in which the metal of the cathode reacts with a reactive gas mixture to form a gas phase containing the components of the protective layer, and quenching the protective layer components from the gas phase onto the substrate. As used herein the term metal refers to titanium metal and silicon which can be classified as a semi-metal.

Preferably, the reactive gas mixture is an argon/nitrogen gas mixture or an argon/methane mixture, or an argon/nitrogen/methane gas mixture.

In a preferred embodiment of the above methods of the present invention, the substrate is bombarded with argon ions, such as by bias sputtering.

During the coating process, the temperature of the substrate preferably is from 200° to 1,000° C. It is also preferred that during the coating process the argon pressure is from 0.1 to 2 Pa.

It is to be understood that both the foregoing general description and the following detailed description are exemplary and explanatory, but are not restrictive of the invention.

DETAILED DESCRIPTION OF THE INVENTION

Due to the structural and chemical differences, stable crystalline mixed phases between the metallic hard materials TiN and TiC and the covalent hard materials SiC and Si are not possible.

These hard materials exhibit a wide mixing gap. Silicon and titanium can not assure an equivalent lattice position under normal conditions.

However, theoretical considerations on the thermodynamics and kinetics of the deposition of layers having multiple components have yielded that, for example, in the systems—TiN-SiC, TiC-SiC, TiN-Si and TiC-$Si_3N_4$—ranges of concentration must exist in which the system components are present in meta-stable equilibrium.

With homogeneous distribution of elements, these meta-stable ranges exhibit less energy with respect to competing mixed phases (amorphous phase, mixed phase of the Wurtzite-type, liquid phase) and are thereby stabilized, i.e. meta-stable.

Such stabilized mixed phases can be obtained by quenching the depositing components from the gas phase within specific ranges of concentration.

The components crystallize into a simple crystal structure, e.g. in the face-centered cubic crystal lattice and have,. therefore, good mechanical properties.

The mobility of the components that is essential for the formation of the structure of the layer according to the present invention can be obtained, for example, by means of simultaneous ion bombardment with argon ions, such as by bias sputtering, or by means of a good choice of substrate temperature, or by means of the combination of both methods.

Thus, the formation of completely amorphous layers can be effectively impeded.

Of course, protective layers are known that are comprised of TiN and AlN and have a NaCl crystal structure. See, W. D. Munz. *Journal of Vacuum Science & Technology A*, Second Series. Volume 4 (6). pages 2717 to 2725. Nov./Dec. 1986. However, the nitride of the metal aluminum has less favorable properties as compared to the nitride and carbide of the semi-metal silicon. In particular, this is reflected in the lower Vickers hardness of HV 2100 to 2300 that is achieved with the nitride of the metal aluminum as compared to the protective layers of the present invention.

The relationship will be explained in-depth with an example of the TiC-SiC system.

Figure 1:
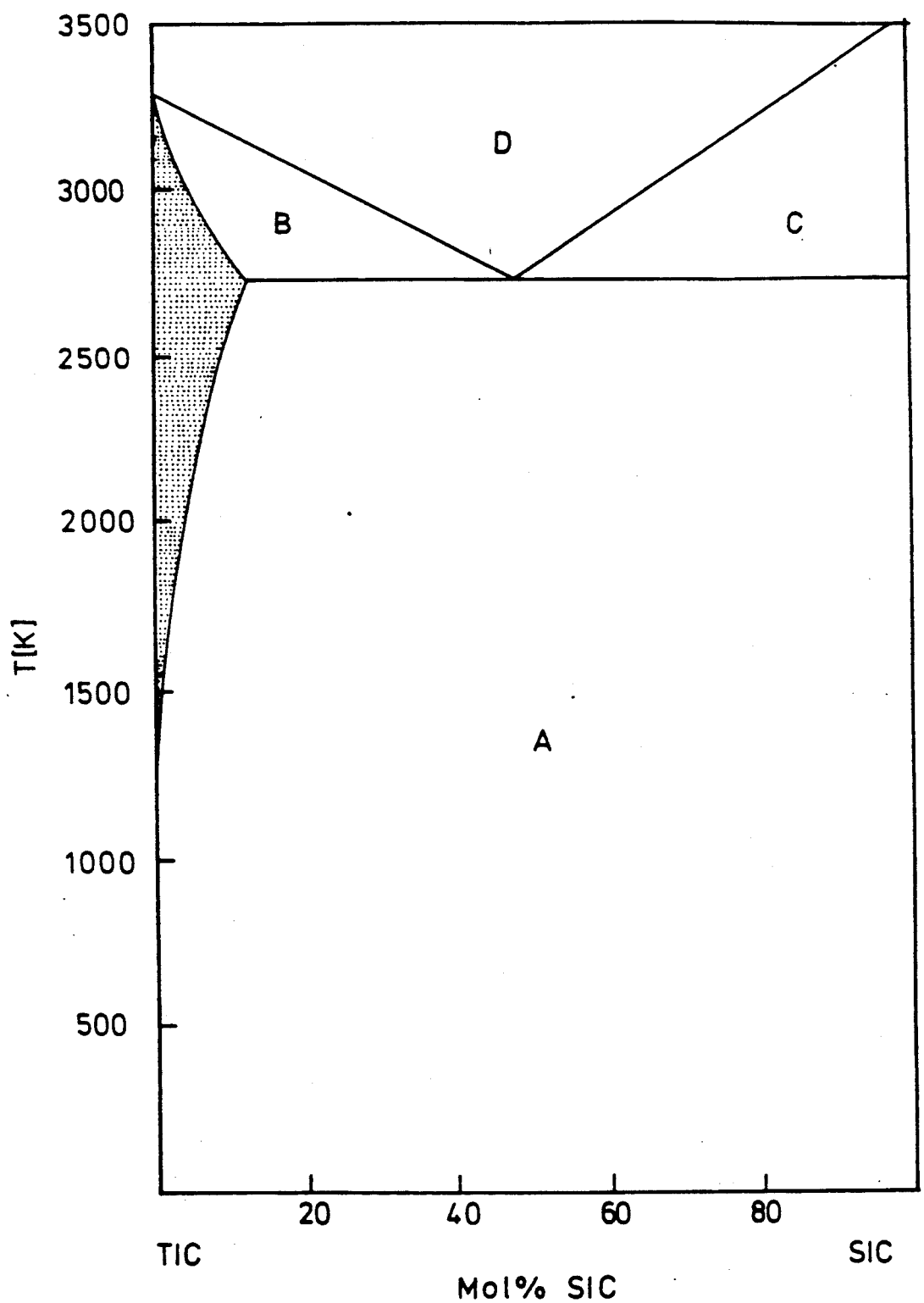
FIG. 1 is a phase diagram of the ternary system (Ti-Si)C, calculated as TiC-SiC.

FIG. 1 shows the calculated phase diagram for the ternary system Ti-Si-C. calculated as TiC-SiC. in a state of equilibrium. This phase diagram was confirmed experimentally by means of random samples. Area A in FIG. 1 represents a normal two phase equilibrium region of TiC+SiC. Area B of FIG. 1 represents a two phase region of TiC+melt. Area C of FIG. 1 represents a two phase region of SiC+melt. Area D of FIG. 1 represents a phase which contains only melt. Since the normal two-phase equilibrium state represented by area A (two phase region of TiC +SiC) cannot be obtained from the gas phase under the defined conditions, the system goes over into the least stable state with a homogeneous distribution of elements.

Figure 2:
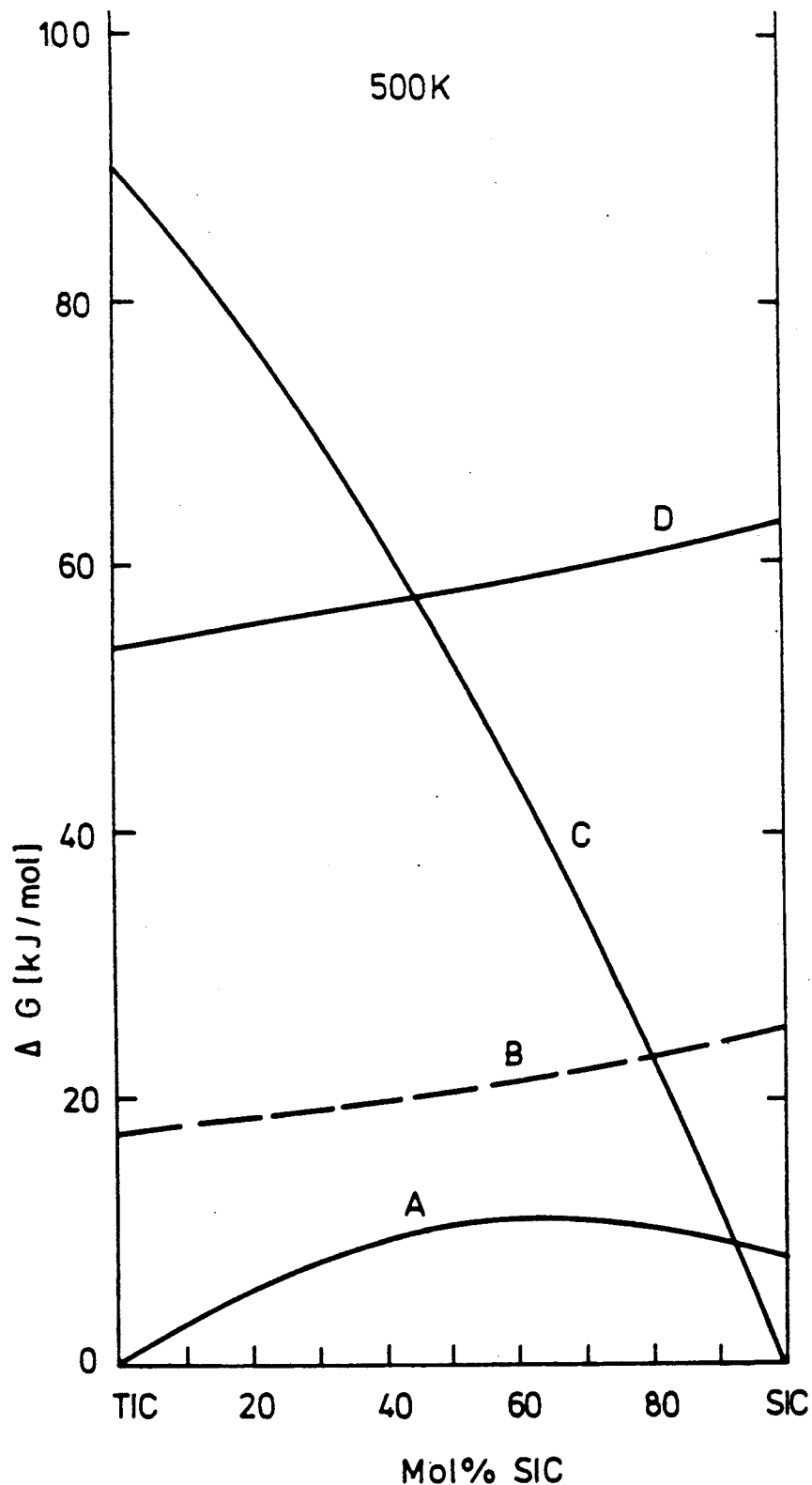
FIG. 2 is a diagram showing the calculated free enthalpies of formation for various unstable or meta-stable phases in the TiC-SiC system.

FIG. 2 shows the free enthalpies of formation (which are a measure for the stability of a phase) of various unstable or meta-stable mixed phases in the TiC-SiC system. The free enthalpies of formation were normalized to G=0 kJ/mol for the stable phase of equilibrium. It is clear that in a concentration ranging from >0% SiC to 80% SiC (remainder TiC) the face-centered cubic mixed phase (Curve A) is less unstable than the other competing mixed phases (Curve B: amorphous TiC/SiC phase. Curve C: hexagonal (Wurtzite type).phase of the type ZnO. Curve D: liquid phase).

Thus, according to the calculations, it should be possible in this system to obtain a new type of layer material—that has never been manufactured up until now, e.g. of the composition $(Ti_{0.5}Si_{0.5})C$ having a face-centered cubic structure, which, of course, compared to the de-mixed TiC+SiC system, is less favorable with respect to energy but with respect to all competing states with homogeneous distribution of elements exhibits lower energy.

Figure 3:
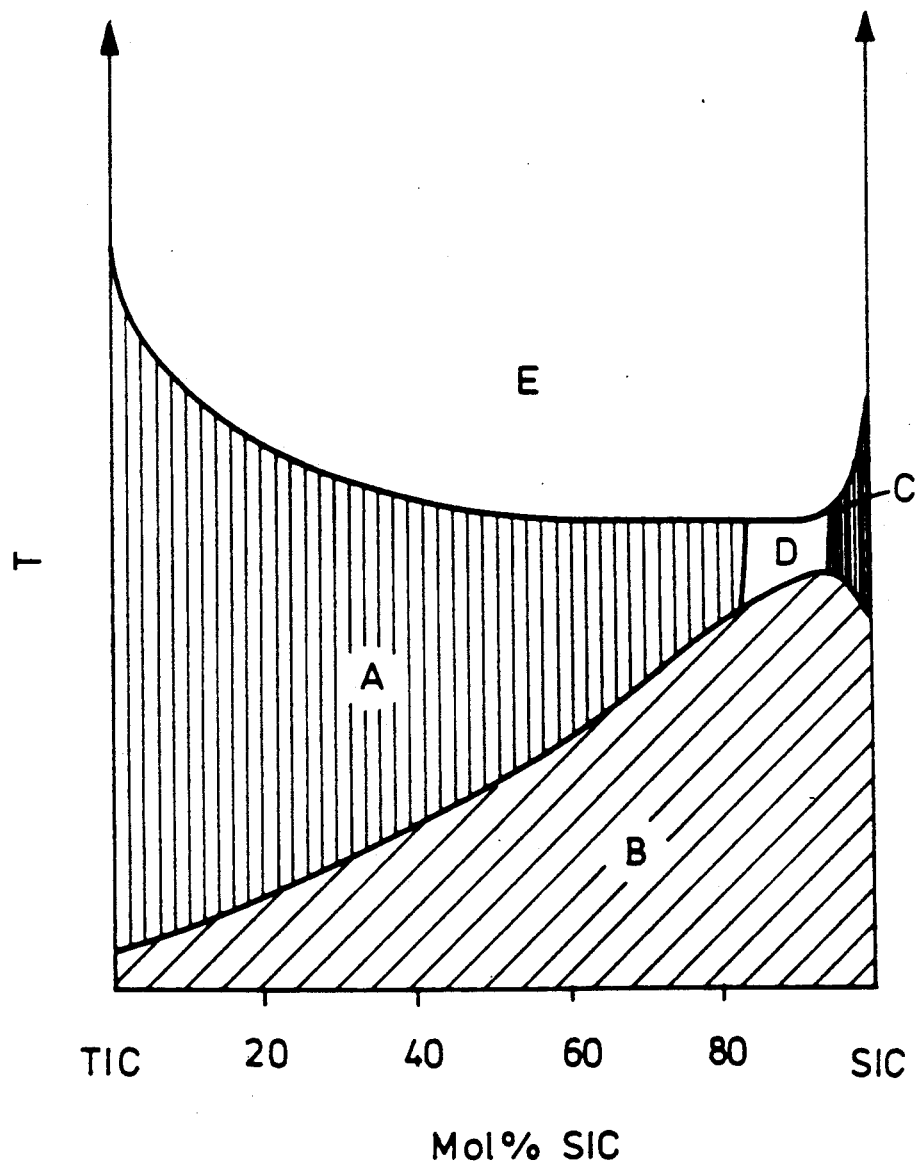
FIG. 3 is a vapor phase deposition phase field diagram of deposition temperature T versus composition of the TiC-SiC system.

FIG. 3 is a physical vapor deposition-phase field diagram of deposition temperature versus composition of the TiC-SiC system. Area A of FIG. 3 represents the temperature and composition range of the face-centered cubic (Ti,Si) mixed phase of the present invention, which enables the manufacture of the mixed phase of the present invention. Based on the composition, the deposition temperature T (the substrate temperature) which is employed can be selected in such a manner that the face-centered cubic mixed phase obtained in the TiC-SiC system is formed.

Area B of FIG. 3 corresponds to the amorphous (nano-crystalline) (Ti,Si)C mixed phase.

It follows from FIG. 3 that as the SiC content increases, the minimum substrate or deposition temperature T which will bring about formation of the crystalline mixed phase of the present invention increases.

When the SiC content is over 80% SiC (area D of FIG. 3), a two-phased system is formed from face-centered cubic and hexagonal crystals. Then with an even higher SiC content and corresponding temperature (area C of FIG. 3), the hexagonal (Si, Ti) mixed phase is formed. Area E of FIG. 3 represents the equilibrium phases TiC+SiC.

The following examples are given by way of illustration to further explain the principles of the invention. These examples are merely illustrative and are not to be understood as limiting the scope and underlying principles of the invention in any way. All percentages referred to herein are by weight unless otherwise indicated.

In the following examples, the cathodes were manufactured in each case by means of powder-metallurgical methods at a pressure of 26 MPa and a temperature ranging from 1,800° to 2,100° C.

The sintering time for manufacturing the cathodes was 15 minute.

According to this treatment, the composition of the cathode of Example 1 was a two-phased composition matching the phase area A in FIG. 1. The composition of the cathode of Example 2 similarly was two phased, matching the corresponding phase area of the TiN-SiC system in which the crystalline (e.g., face-centered cubic) mixed phase of the present invention is obtained.

EXAMPLE 1

By means of magnetron sputtering of a TiC/SiC cathode (manufactured by means of hot pressing equimolar portions of SiC and TiC at 2,100° C.) with a direct current surface power of 11 W/cm², a layer growth rate of 8 μm/h and an argon pressure of 0.8 Pa, 5 μm thick layers were manufactured on the hard metallic substrates listed in the Table which appears in Example 2.

Figure 4:
FIG. 4 is a REM picture showing the microstructure of a composite article containing a substrate and a protective layer according to one embodiment of the present invention.

FIG. 4 is a REM picture showing the microstructure of a fractured surface of a hard metal substrate+$(Ti_{0.5}Si_{0.5})C$ layer manufactured according to Example 1. The substrate is presented in the lower half of the picture, and the layer of $(Ti_{0.5}Si_{0.5})C$ is above it.

The X-ray photographic test yielded at a substrate temperature of 200° C. very wide diffraction reflections, which must be assigned to the 111-200 reflections of the face-centered cubic structure. The layers made of the meta-stable layer material $(Ti_{0.5}Si_{0.5})C$ have a face-centered cubic structure, exhibit excellent adhesion to the hard metallic substrates, high hardness (2.700 $HV_{0.05}$), good resistance to oxidation and high resistance to crack propagation.

EXAMPLE 2

By means of magnetron sputtering of a TiN/SiC cathode (manufactured by means of hot pressing equimolar portions of TiN and SiC at 1,900° C.) with a surface power of 11 W/cm², a layer growth rate of 5 μm/h and an argon pressure of 0.8 Pa. 5μm thick layers were manufactured on the hard metallic substrates shown in the Table below.

These layers show improved resistance to oxidation, good adhesion, and a good hardness to toughness ratio.

The following table shows a list of substrate materials, which were coated with TiC/SiC. TiN/SiC. and $Si_3N_4$/TiC according to the invention.

The composition of the substrates is given in % by weight.

| Composition of the Substrate | | | Tests Conducted with The |
|---|---|---|---|
| WC | Co | (Ti, Ta, Nb)C | Coated Substrates |
| 1. 94 | 6 | 0 | X-ray diffraction |
| 2. 85.5 | 6 | 8.5 | layer properties |
| 3. 81 | 7 | 12 | wear behavior |
| 4. 70 | 10 | 20 | wear behavior |

It will be understood that the above description of the present invention is susceptible to various modifications, changes and adaptations, and the same are intended to be comprehended within the meaning and range of equivalents of the appended claims.

What is claimed is:

1. A primarily crystalline, titanium-containing protective layer of hard material having a homogeneous distribution of elements for a surface of a substrate material, the protective layer comprising a single, meta-stable mixed phase having a face-centered cubic crystal structure made of a metallic hard material which is at least one material selected from titanium nitride (TiN) or titanium carbide (TiC). and a covalent hard material which is at least one material selected from silicon carbide (SiC) or silicon nitride ($Si_3N_4$).

2. The protective layer of claim 1, wherein the meta-stable mixed phase is a TiN-SiC mixed phase.

3. The protective layer of claim 1, wherein the meta-stable mixed phase is a TiC-SiC mixed phase.

4. The protective layer of claim 3, wherein the mixed phase has the composition $(Ti_{0.5}-Si_{0.5})C$.

5. The protective layer of claim 1, wherein the meta-stable mixed phase is a $TiN-Si_3N_4$ mixed phase.

6. The protective layer of claim 1, wherein the meta-stable mixed phase is a $TiC-Si_3N_4$ mixed phase.

7. The protective layer according to claim 1, wherein the protective layer is a single layer.

8. The protective layer according to claim 1, wherein the protective layer is in the form of a multi-layer coating.

* * * * *